(12) United States Patent
Okayama et al.

(10) Patent No.: US 11,377,757 B2
(45) Date of Patent: Jul. 5, 2022

(54) METHOD FOR PRODUCING GROUP III NITRIDE CRYSTAL AND SEED SUBSTRATE

(71) Applicants: PANASONIC CORPORATION, Osaka (JP); OSAKA UNIVERSITY, Osaka (JP)

(72) Inventors: Yoshio Okayama, Osaka (JP); Shinsuke Komatsu, Osaka (JP); Masahiro Tada, Osaka (JP); Yusuke Mori, Osaka (JP); Masayuki Imanishi, Osaka (JP); Masashi Yoshimura, Osaka (JP)

(73) Assignees: PANASONIC HOLDINGS CORPORATION, Osaka (JP); OSAKA UNIVERSITY, Osaka (JP)

( * ) Notice: Subject to any disclaimer, the term of this patent is extended or adjusted under 35 U.S.C. 154(b) by 181 days.

(21) Appl. No.: 16/792,386

(22) Filed: Feb. 17, 2020

(65) Prior Publication Data

US 2020/0263320 A1    Aug. 20, 2020

(30) Foreign Application Priority Data

Feb. 20, 2019  (JP) .............................. JP2019-028247

(51) Int. Cl.
| | |
|---|---|
| *C30B 29/40* | (2006.01) |
| *C30B 15/36* | (2006.01) |
| *C30B 15/00* | (2006.01) |
| *C30B 19/02* | (2006.01) |
| *C30B 25/18* | (2006.01) |

(52) U.S. Cl.
CPC .......... *C30B 29/406* (2013.01); *C30B 15/007* (2013.01); *C30B 15/36* (2013.01); *C30B 19/02* (2013.01); *C30B 25/18* (2013.01)

(58) Field of Classification Search
CPC ....... C30B 29/406; C30B 19/02; C30B 25/18; C30B 15/007; C30B 15/36; C30B 19/12
See application file for complete search history.

(56) References Cited

U.S. PATENT DOCUMENTS

| | | | |
|---|---|---|---|
| 2003/0140846 A1* | 7/2003 | Biwa ...................... | C30B 25/02 117/89 |
| 2010/0059717 A1 | 3/2010 | Mori et al. | |

(Continued)

FOREIGN PATENT DOCUMENTS

| | | |
|---|---|---|
| JP | 4538596 B2 | 9/2010 |
| JP | 2014-055091 A | 3/2014 |

(Continued)

*Primary Examiner* — Matthew J Song
(74) *Attorney, Agent, or Firm* — Pearne & Gordon LLP

(57) ABSTRACT

An object of the present invention is to provide a method for producing a group III nitride crystal in which generation of breaking or cracks is less likely to occur. To achieve the object, the method for producing a group III nitride crystal includes: seed crystal preparation including disposing a plurality of crystals of a group III nitride as a plurality of seed crystals on a substrate; and crystal growth including growing group III nitride crystals by contacting a surface of each of the seed crystals with a melt containing at least one group III element selected from gallium, aluminum, and indium and an alkali metal in an atmosphere containing nitrogen. In the seed crystal preparation, the plurality of seed crystals are disposed within a hexagonal region provided on the substrate.

9 Claims, 13 Drawing Sheets

(56) References Cited

U.S. PATENT DOCUMENTS

| | | | |
|---|---|---|---|
| 2011/0253974 A1* | 10/2011 | Horie | H01L 33/06 |
| | | | 257/13 |
| 2014/0065360 A1* | 3/2014 | D'Evelyn | C30B 29/403 |
| | | | 428/141 |
| 2014/0328742 A1 | 11/2014 | Mori et al. | |
| 2017/0073840 A1* | 3/2017 | Mori | H01L 21/02581 |
| 2017/0191186 A1 | 7/2017 | Mori et al. | |
| 2017/0314157 A1 | 11/2017 | Mori et al. | |
| 2018/0087185 A1 | 3/2018 | Yoshida | |

FOREIGN PATENT DOCUMENTS

| | | |
|---|---|---|
| JP | 5904421 B2 | 4/2016 |
| JP | 2017-122013 A | 7/2017 |
| JP | 2017-200858 A | 11/2017 |
| JP | 2018-052777 A | 4/2018 |

* cited by examiner

METHOD FOR PRODUCING GROUP III NITRIDE CRYSTAL AND SEED SUBSTRATE

CROSS REFERENCE TO RELATED APPLICATIONS

This application is entitled to and claims the benefit of Japanese Patent Application No. 2019-028247, filed on Feb. 20, 2019, the disclosure of which including the specification, drawings and abstract is incorporated herein by reference in its entirety.

TECHNICAL FIELD

The present disclosure relates to a method for producing a group III nitride crystal and a seed substrate.

BACKGROUND ART

Crystals of group III nitrides such as GaN have recently attracted attention as materials of light-emitting diodes and so on. Known as one of methods for producing such a crystal of a group III nitride is a flux method, in which a group III element and nitrogen are reacted in a melt (flux) of an alkali metal such as Na to grow a crystal of high quality with few crystal defects (dislocations) (for example, see Japanese Patent No. 4538596). Another method to obtain a group III nitride crystal of large size is disclosed, in which a plurality of group III nitride layers each formed on a sapphire substrate through metal-organic chemical vapor deposition (MOCVD) or the like are used as seed crystals, and a group III nitride crystal is grown by contacting the seed crystals with a melt of an alkali metal (for example, see Japanese Patent Application Laid-Open No. 2014-55091 and Japanese Patent No. 5904421).

SUMMARY OF INVENTION

Technical Problem

According to a conventional production method disclosed in Patent Literature 3, as illustrated in FIG. 12, a group III nitride crystal can be grown by disposing a plurality of seed crystals (not shown) on circular region 32 for disposing seed crystals in disk-like substrate 31. In this case, as illustrated in FIG. 13, group III nitride crystal 33 in a large size generally the same as the size of substrate 31 is obtained. Although depending on the growth conditions, however, the outer periphery of group III nitride crystal 33 obtained is composed of the most stable crystal plane (for example, the (1-100) plane for GaN). Hence, as illustrated in FIG. 13, structure (jagged portion) 33a including intermittently disposed minute (1-100) planes is generated in some regions of the outer periphery. In such substrates, jagged portion 33a tends to act as the origin of generation of breaking or cracks. That is, the conventional method has a problem of difficulty in producing a group III nitride crystal substrate of large size with a satisfactory yield.

An object of the present disclosure is to provide a method for producing a group III nitride crystal in which generation of breaking or cracks is less likely to occur, and a seed substrate.

Solution to Problem

A method for producing a group III nitride crystal according to the present disclosure comprises: seed crystal preparation including disposing a plurality of crystals of a group III nitride as a plurality of seed crystals on a substrate; and crystal growth including growing a group III nitride crystal on each of the seed crystals by contacting a surface of each of the seed crystals with a melt containing at least one group III element selected from gallium, aluminum, and indium and an alkali metal in an atmosphere containing nitrogen, wherein in the seed crystal preparation, the plurality of seed crystals are disposed within a hexagonal region provided on the substrate.

Further, a seed substrate according to the present disclosure comprises: a substrate; and a plurality of seed crystals including a plurality of crystals of a group III nitride, the crystals disposed within a hexagonal region provided on the substrate.

Advantageous Effects of Invention

When the method for producing a group III nitride crystal according to the present disclosure is applied, the group III nitride crystal to be grown attains a linear outermost periphery. Thus, generation of breaking or cracks is less likely to occur in the group III nitride crystal, and group III nitride crystals can be produced with satisfactory yields.

DESCRIPTION OF EMBODIMENTS

Now, the method for producing a group III nitride crystal according to an embodiment of the present disclosure, and a seed substrate for use in the method will be described by exemplifying an embodiment to form a GaN crystal as the group III nitride crystal. In the accompanying drawings, substantially identical members are provided with an identical reference sign. Directions with a negative component in Miller indices are conventionally expressed with a bar above a number; however, they are herein expressed with "−" (negative sign) for convenience.

Embodiment 1

The method for producing a group III nitride crystal according to the present embodiment includes: seed crystal preparation including disposing a plurality of group III nitride crystals in dots as a plurality of seed crystals on a substrate; and crystal growth including growing a group III nitride crystal on each of the seed crystals by contacting a surface of each of the seed crystals with a melt containing at least one group III element selected from gallium, aluminum, and indium and an alkali metal in an atmosphere containing nitrogen. In the seed crystal preparation, the plurality of seed crystals are disposed within a hexagonal region provided on the substrate.

Figure 1:
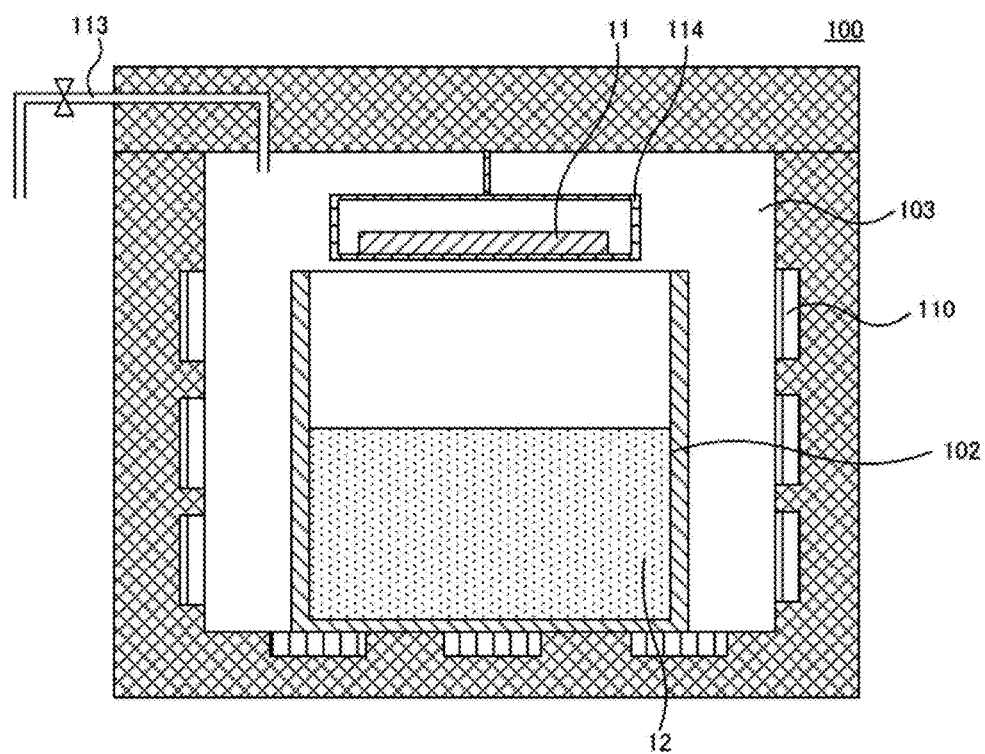
FIG. 1 is a schematic cross-sectional view illustrating an example of production apparatuses for group III nitride crystals for use in Embodiment 1 of the present disclosure, in the situation that a substrate has been pulled out of a melt.
Figure 2:
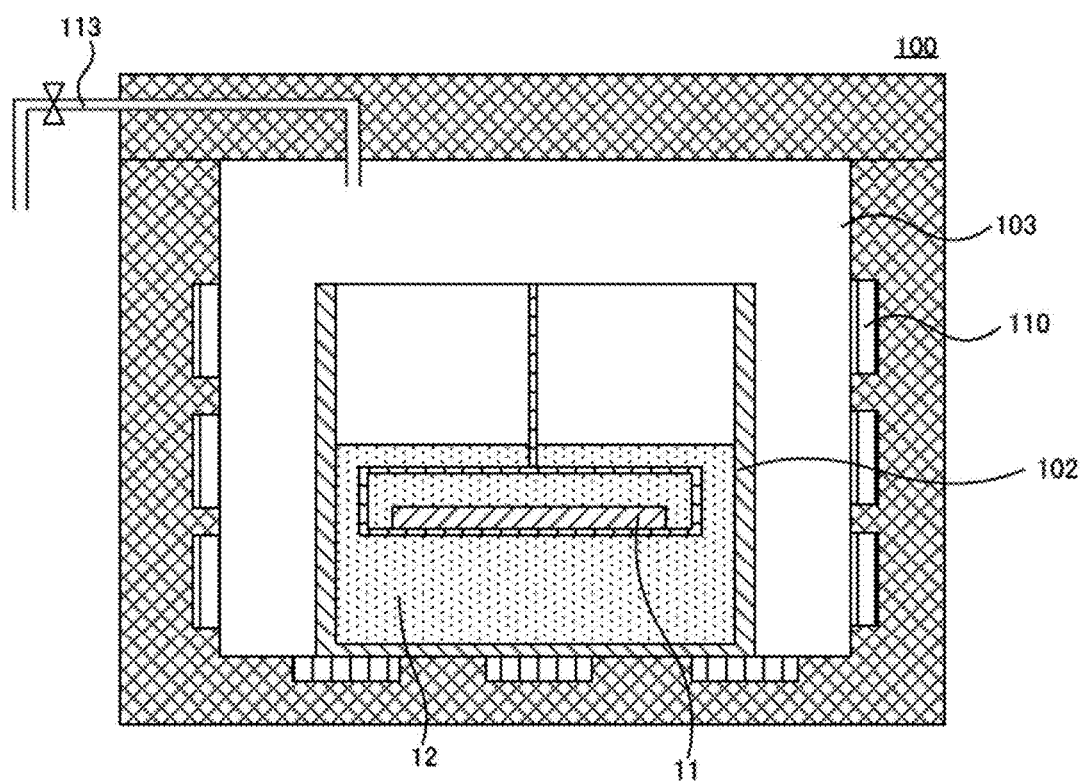
FIG. 2 is a schematic cross-sectional view illustrating the production apparatus for group III nitride crystals in FIG. 1, in the situation that the substrate is soaked in the melt.

FIG. 1 is a schematic cross-sectional view illustrating an example of production apparatus 100 for group III nitride crystals for use in Embodiment 1 of the present disclosure, in the situation that substrate 11 with seed crystals formed thereon (hereinafter, also referred to as "seed substrate") has been pulled out of melt 12. FIG. 2 is a schematic cross-sectional view illustrating production apparatus 100 for group III nitride crystals in FIG. 1, in the situation that seed substrate 11 is soaked in melt 12. FIGS. 3 to 10 are each a schematic top view or schematic cross-sectional view illustrating the seed substrate for use in the production of a group III nitride crystal according to Embodiment 1 or illustrating a step in the production method. The method for producing a group III nitride crystal according to Embodiment 1 includes: seed crystal preparation illustrated in FIG. 6; and crystal growth illustrated in FIG. 7.

(Seed Crystal Preparation)

Figure 3:
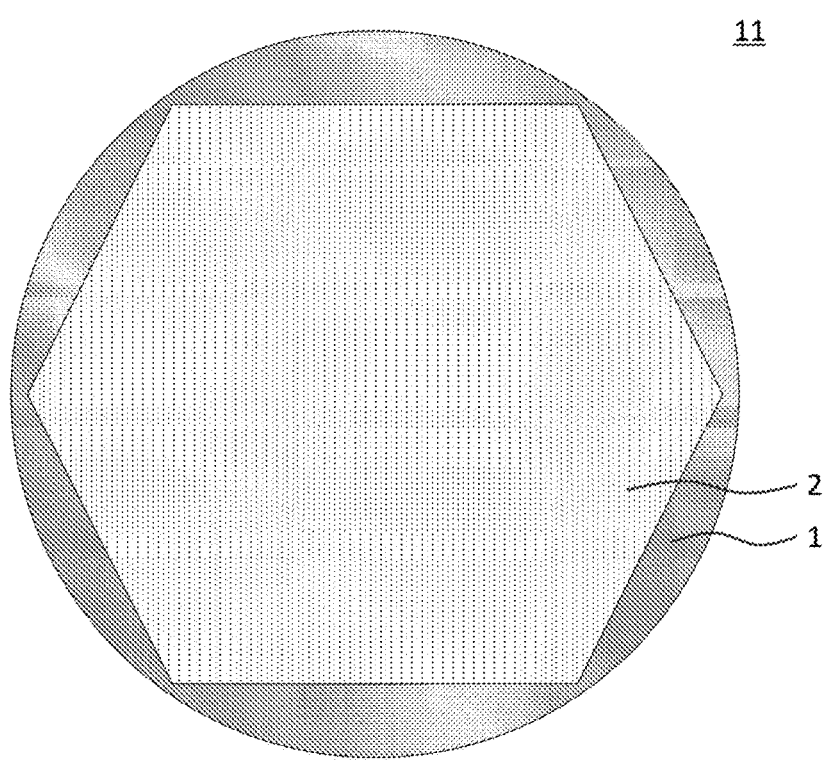
FIG. 3 is a schematic top view illustrating an example of seed substrates for use in the production of a group III nitride crystal according to Embodiment 1 of the present disclosure.
Figure 4:
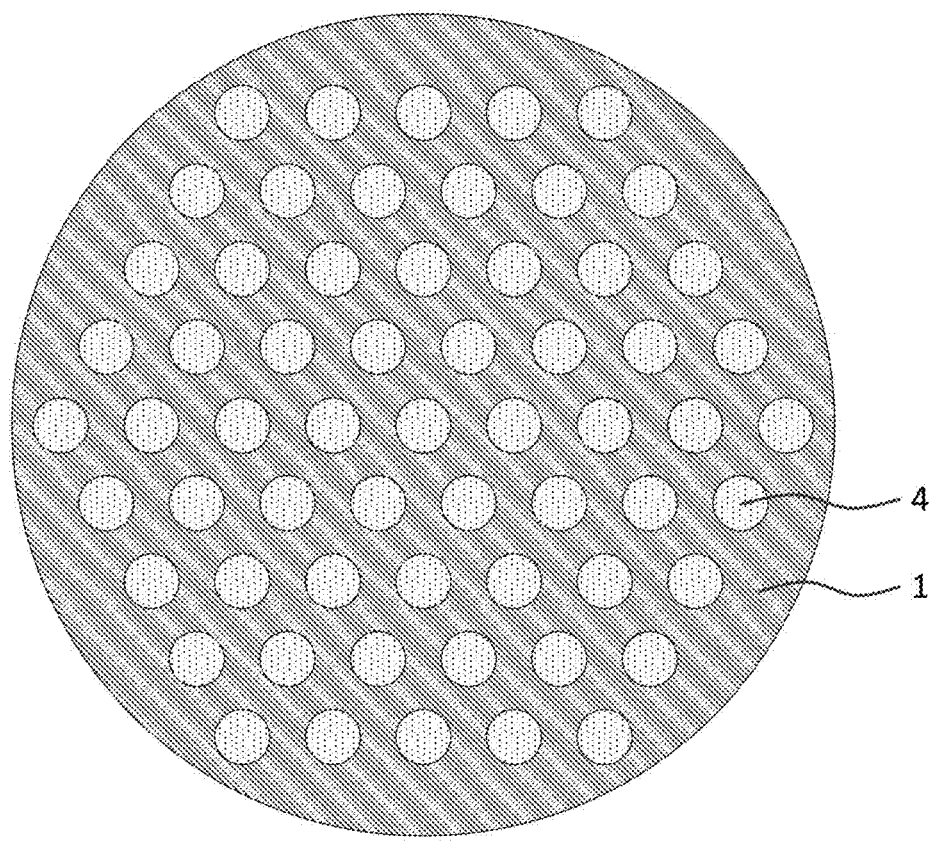
FIG. 4 is a schematic top view illustrating an example of seed substrates for use in the production of a group III nitride crystal according to Embodiment 1 of the present disclosure.

In the seed crystal preparation, within hexagonal region 2 provided on the top surface of substrate 1 as illustrated in FIG. 3, a plurality of crystals 4 in dots of a group III nitride are disposed as seed crystals as illustrated in FIG. 4.

In the present embodiment, substrate 1 consisting of sapphire is prepared as a substrate for the seed substrate to be used in production of a crystal. Sapphire is preferred in that the differences of the lattice constants and the coefficient of thermal expansion from those of GaN are relatively small. Not only sapphire, but also SiC, GaAs, ScAlMgO$_4$, and so on may be used as substrate 1. The thickness of substrate 1 is preferably about 100 to 3,000 μm, and more preferably 400 to 1,000 μm. With the thickness of substrate 1 being within the range, the strength is sufficiently high, and breaking or the like is less likely to occur in forming a GaN crystal. The shape of substrate 1 is not limited to a particular shape; in view of practical use in the industry, however, a wafer of about 50 to 200 mm in diameter is preferred.

On substrate 1 consisting of sapphire, a thin film consisting of a GaN monocrystal (not shown) is formed by using the MOCVD method. The thickness of the thin film is preferably about 0.5 to 100 μm, and more preferably 1 to 5 μm. With setting the thickness of the thin film to 0.5 μm or larger, the thin film formed is a satisfactory monocrystal, and generation of lattice defects or the like is less likely to occur in a crystal of GaN to be obtained. The dislocation density of the GaN thin film formed on sapphire through the MOCVD method is typically about $10^7/cm^2$ to $10^9/cm^2$.

As necessary, a buffer layer (not shown) may be further formed between substrate 1 and the thin film. The buffer layer is a layer to form a GaN monocrystal thin film of high quality above substrate 1 consisting of sapphire, and a layer to buffer the differences in lattice constants between sapphire and GaN. The buffer layer is preferably a material with lattice constants close to those of sapphire and GaN, and can be a layer consisting of a group III nitride such as GaN. The buffer layer is preferably an amorphous or polycrystalline layer grown through the MOCVD method at a relatively low temperature of 400° C. or higher and 700° C. or lower. If such a buffer layer is used, generation of lattice defects or the like is less likely to occur in the GaN monocrystal thin layer to be formed on the buffer layer. The thickness of the buffer layer is preferably 10 nm or larger and 50 nm or smaller, and more preferably 20 nm or larger and 40 nm or smaller. With the thickness of the buffer layer being 10 nm or larger, the effect of buffering differences in lattice constants is exerted, and generation of lattice defects or the like is less likely to occur in a crystal of GaN to be obtained. If the thickness of the buffer layer is excessively large, on the other hand, information on the crystal lattice of substrate 1 consisting of sapphire is lost, resulting in failure in satisfactory epitaxial growth.

Subsequently, a part of the thin film consisting of a GaN monocrystal is removed by using a known method with photolithography and etching, forming a plurality of seed crystals 4 consisting of a plurality of GaN crystals. The shape of each seed crystal 4 is preferably a dot. The size (diameter) of each dot is preferably about 10 to 1,000 μm, and more preferably 50 to 300 μm. It is preferred to dispose dots so that the line connecting the centers of any two adjacent dots almost matches up with the crystal orientation (the a-axis or m-axis) of GaN, a hexagonal crystal. In addition, it is preferred to dispose dots, for example, in triangular lattices as illustrated in FIG. 4, and it is preferred to dispose dots so that the center of each dot constitute vertexes of equilateral triangles when viewed from the top surface. Herein, the situation that the line connecting the centers of any two adjacent dots almost matches up with the crystal orientation (the a-axis or m-axis) of GaN refers to the situation that the angle between the line connecting the centers of the dots (an axis of a triangle lattice) and the crystal orientation (the a-axis or m-axis) of GaN is 10 degrees or smaller, and the angle is preferably 1 degree or smaller.

Further, the pitch of dots (the center-to-center interval) is preferably about 1.5 to 10 times the size (diameter) of each dot, and more preferably 2 to 5 times the size (diameter) of each dot. The shape of each dot is preferably circular or hexagonal. With setting the size, disposition, pitch, and shape of dots as described above, pyramidal crystal growth in initial stages and coupling of pyramidal crystals (GaN crystals) are facilitated when GaN crystals are grown through the flux method. Further provided is an effect of efficiently reducing dislocations carried over from the seed crystals.

Although triangle lattices have been shown as an example of disposition of dots in the above, the present embodiment is not limited thereto. For example, disposition of dots may be in square lattices. However, triangle lattices are particularly preferred because group III nitride crystals (GaN crystal) belong to the hexagonal system. Although a dot has been shown as an example of the shape of each seed crystal 4, the shape is not limited thereto. For example, the shape of each seed crystal 4 may be a stripe, and a network formed by negative-positive reversal of the above-described dots may be used. Even in such a shape, a GaN crystal can be grown on seed crystal 4 so as to attain a cross-sectional shape of a triangular or a trapezoid at initial stages of GaN crystal growth through the flux method. In addition, adjacent GaN crystals can be coupled, and an effect of reducing dislocations carried over from the seed crystals can be also obtained.

The present inventors made examination regarding the region for disposing seed crystals 4 on substrate 1 on the basis of experimental results. Then, crystals were grown on seed crystals 4 in the same manner as the crystal growth described later.

Figure 12:
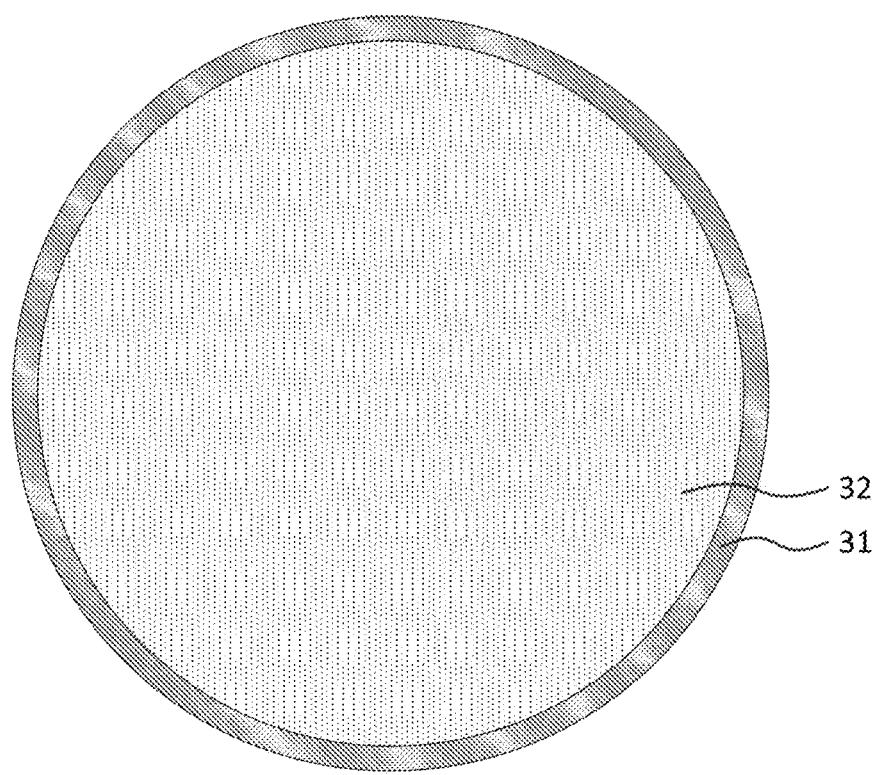
FIG. 12 is a schematic top view illustrating an example of seed substrates for use in conventional production of a group III nitride crystal.
Figure 13:
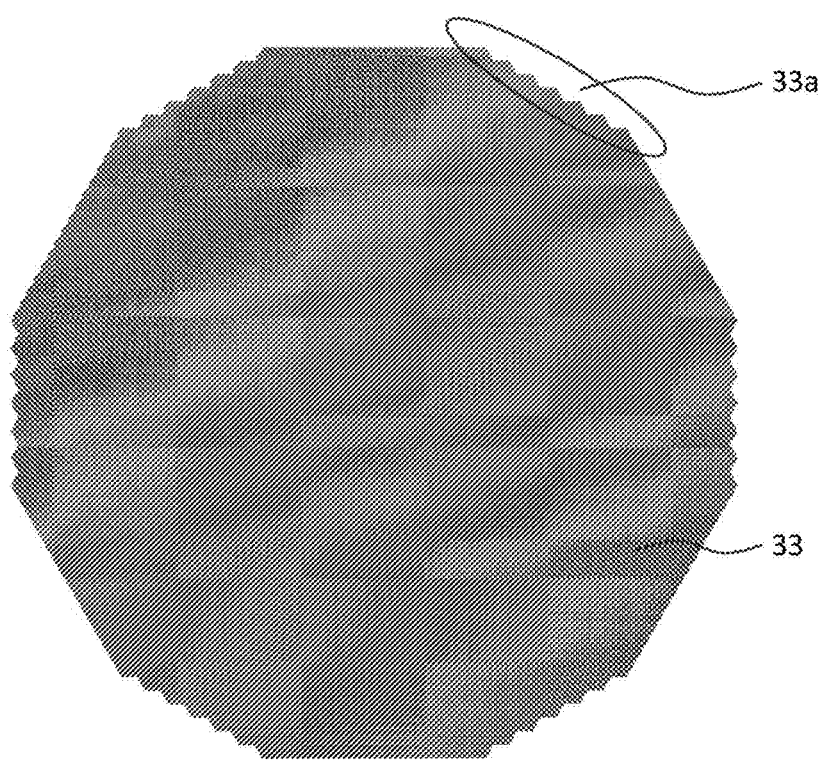
FIG. 13 is a schematic top view illustrating crystal growth in the conventional method for producing a group III nitride crystal.

The shape of substrate 1 is typically a wafer, that is, a disk, from the viewpoint of practical use in the industry. Thus, it is contemplated to set region 32 for disposing seed crystals 4 to a circle as illustrated in FIG. 12. In this case, however, when group III nitride crystals (GaN crystals), each being a hexagonal crystal, were grown on seed crystals 4 and coupled together, a group III nitride crystal having jagged structure 33a in the outer periphery as illustrated in FIG. 13 was obtained. This is because, as described above, the outer periphery is the most stable crystal plane in a group III nitride crystal (the (1-100) plane for GaN), and hence minute (1-100) planes were intermittently generated.

In view of this, the present inventors attempted to set the region for disposing seed crystals 4 not to a circle but to a hexagon so as not to allow formation of minute jags along the outer periphery of a grown group III nitride crystal; and found that with the method, group III nitride crystals tend to have a linear outer periphery. The reason for setting the region for disposing to a hexagon is that group III nitride crystals have a hexagonal system, and that if the region is a triangle, the surface of disk-like substrate 1 cannot be effectively used and the size of a group III nitride crystal grown is disadvantageously small.

Here, it is preferred to allow each side of the outer periphery of the hexagonal region for disposing to almost match up with a specific crystal plane of the group III nitride crystal to be grown in crystal growth described later, and it is more preferred to allow each side of the outer periphery to almost match up with the (1-100) plane of the group III nitride crystal. The situation that each side of the outer periphery of the hexagon "almost match up" with a specific crystal plane refers to the situation that the angle between each side of the outer periphery and a crystal plane is 10 degrees or smaller, and the angle is preferably 1 degree or smaller. When each side of the outer periphery of the hexagon is almost matching up with a specific crystal plane of the group III nitride crystal, the grown group III nitride crystal tends to have a linear outer periphery by carrying over the specific crystal plane. It follows that formation of minute jags that can act as the origin of generation of breaking or cracks is less likely to occur. Further, when each side of the outer periphery of the hexagon is almost matching up with the (1-100) plane, which is a stable crystal plane of GaN, the outer periphery of the grown group III nitride crystal tends to form a hexagon composed of (1-100) planes by carrying over the hexagonal shape, and formation of minute jags is less likely to occur. The crystal orientation of growing GaN depends on the crystal orientation of substrate 1. For example, the plane orientation of GaN under epitaxial growing on the a-plane of sapphire (the (11-20) plane) is (1-100). Hence, it is needed to appropriately adjust the crystal orientation of substrate 1 so as to provide the group III nitride crystal with desired crystal orientation.

In forming seed crystals in dots, for example, by using photolithography or laser processing, seed crystals nearest to the outer periphery of the hexagon may be partially shaved off. It has been revealed from experimental results that when such a seed substrate is used, minute jags tend to form along the outer periphery of the grown group III nitride crystal. Therefore, it is preferred for preventing this phenomenon to allow a seed crystal the nearest to the periphery of the hexagonal region have the same shape as seed crystals near the center of the hexagonal region.

Figure 7:
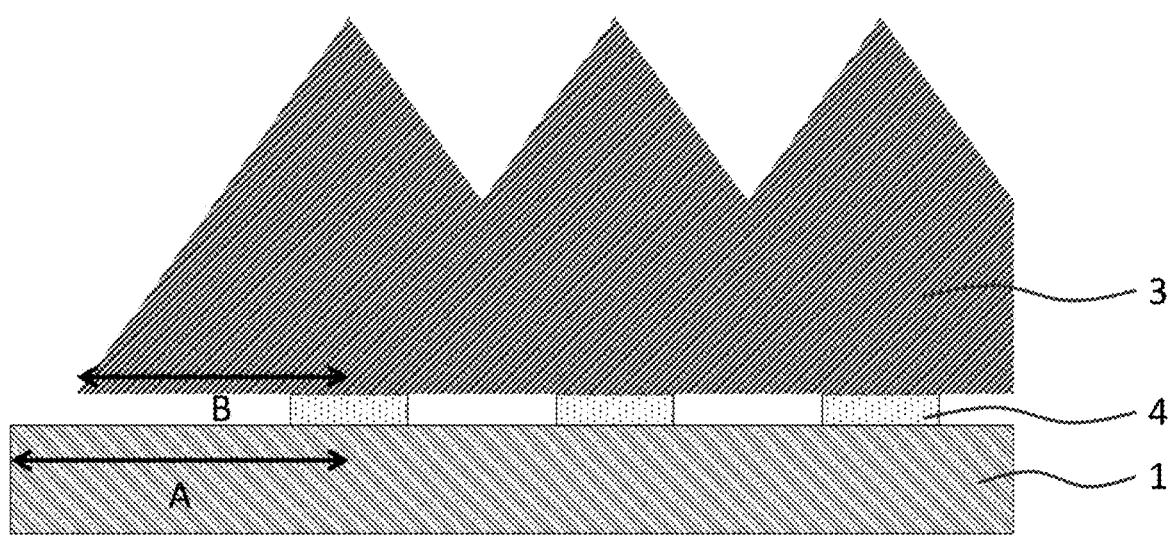
FIG. 7 is a schematic cross-sectional view illustrating crystal growth (first crystal growth) in the method for producing a group III nitride crystal according to Embodiment 1 of the present disclosure.
Figure 11:
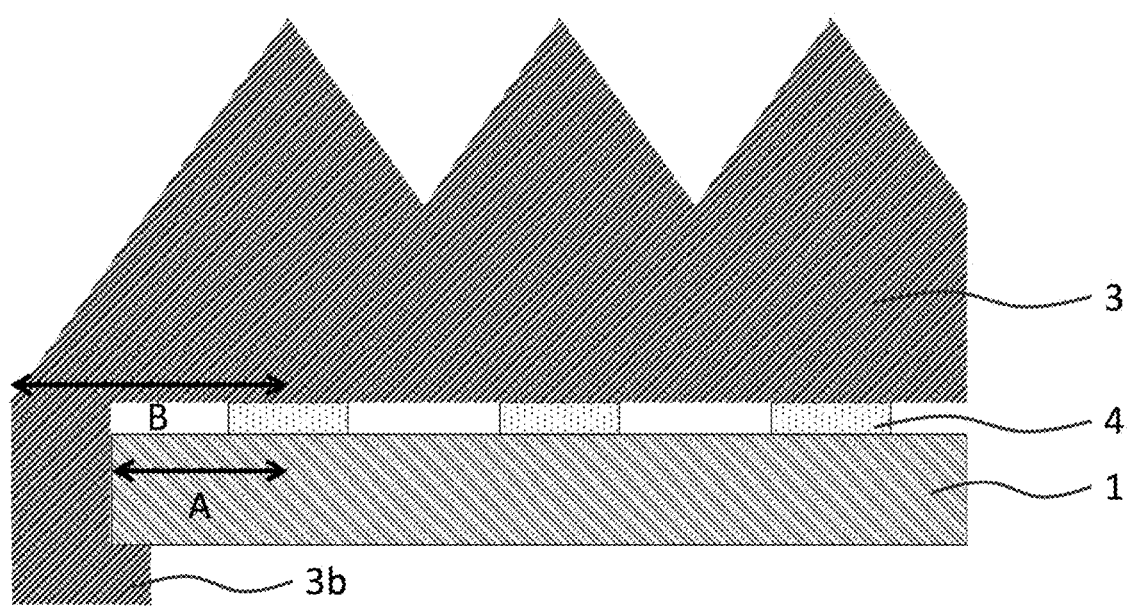
FIG. 11 is a schematic cross-sectional view for describing the crystal growth in the method for producing a group III nitride crystal.

Examination was made on the distance between the outer periphery of substrate 1 and the center of seed crystal 4 the nearest to the outer periphery of the substrate, A. The results showed that when distance A was small, a structure as illustrated in FIG. 11 was provided such that grown group III nitride crystal 3 went around from the side surface of substrate 1 to the back-surface side thereof. In such a structure, the difference in the coefficient of thermal expansion between substrate (sapphire substrate) 1 and group III nitride crystal (GaN crystal) 3 disadvantageously causes generation of breaking or cracks in group III nitride crystal 3. In growing group III nitride crystals, in particular, crystals of GaN, an inclined plane that appears in each crystal (the first group III nitride crystal described later) is the (1-101) plane or the (11-22) plane. The angle of each plane is approximately 60° to the surface of substrate 1. Therefore, the growth distance in the horizontal direction of group III nitride crystal 3 growing up from seed crystal 4 (the distance denoted as B in FIG. 11) is roughly a value obtained by dividing the film thickness in the vertical direction of a pyramidal crystal (the height of a pyramidal crystal) by the square root of 3. In view of this, as illustrated in FIG. 7, it is preferable that distance A described above be larger than distance B, specifically, the distance between the outermost periphery of substrate 1 and the center of seed crystal 4 the nearest to the outermost periphery, A, be larger than the value obtained by dividing the film thickness of a pyramidal group III nitride crystal by the square root of 3.

Figure 5:
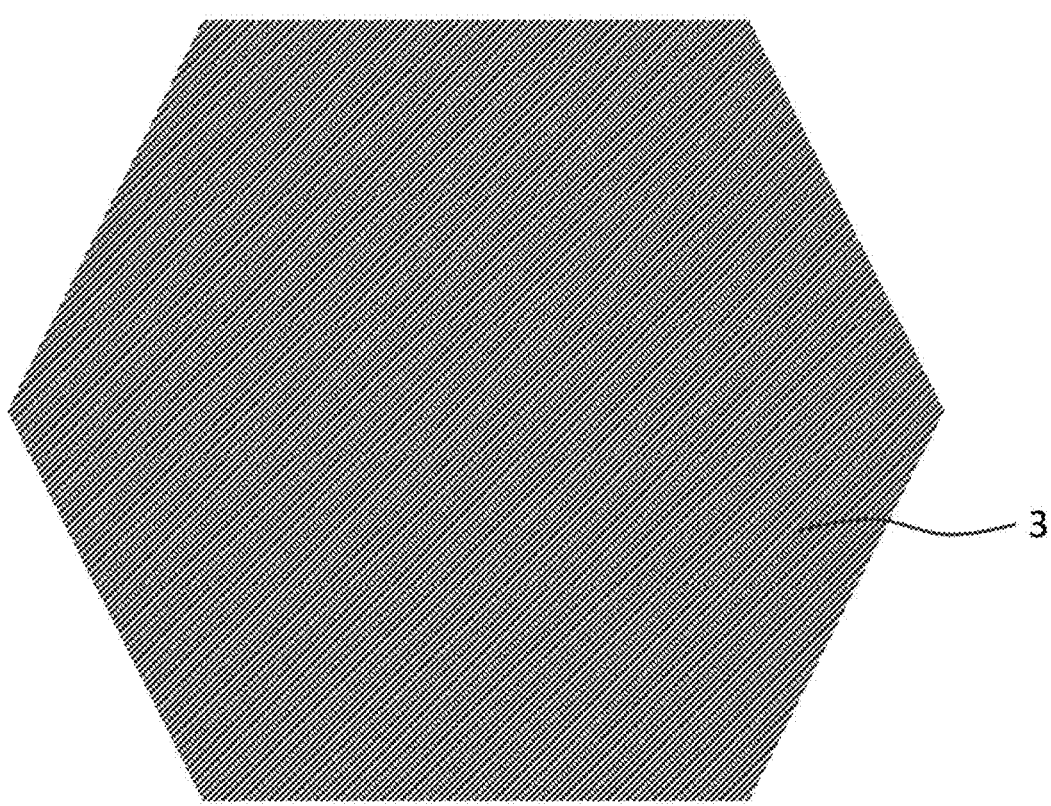
FIG. 5 is a schematic top view illustrating crystal growth in the method for producing a group III nitride crystal according to Embodiment 1 of the present disclosure.
Figure 6:
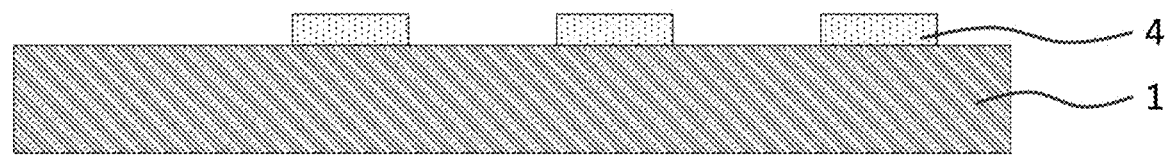
FIG. 6 is a schematic cross-sectional view illustrating seed crystal preparation in the method for producing a group III nitride crystal according to Embodiment 1 of the present disclosure.

FIGS. 3 and 4 each show a schematic top view of seed substrate 11 for use in the present embodiment, the seed substrate including a plurality of GaN crystals in dots as seed crystals 4 within hexagonal region 2 provided on substrate 1. Crystal growth described later was performed by using such seed substrate 11, and as a result the grown GaN crystal formed a hexagon composed of (1-100) planes as illustrated in FIG. 5. In addition, no minute jag was found along the outer peripheral surface, and generation of breaking or cracks was less likely to occur. Thus, a GaN crystal of large size was successfully obtained with a satisfactory yield.

(Crystal Growth)

In crystal growth, as illustrated in FIG. 2, the surface of each of a plurality of seed crystals provided on seed substrate 11 is contacted with melt 12 containing at least one group III element selected from gallium, aluminum, and indium and an alkali metal in an atmosphere containing nitrogen to react the group III element and nitrogen in the melt (herein, also referred to as "first crystal growth"). As a result, as illustrated in FIG. 7, a pyramidal group III nitride crystal grows from each of the plurality of seed crystals 4, and eventually the bottoms of adjacent group III nitride crystals couple to give first group III nitride crystal 3. Use of the above-described seed substrate provides, as illustrated in FIG. 5, the outer periphery of group III nitride crystal (first group III nitride crystal) 3 with a smooth surface composed of a particular crystal plane. Thus, a group III nitride crystal of large size without any breaking or crack can be produced.

Figure 8:
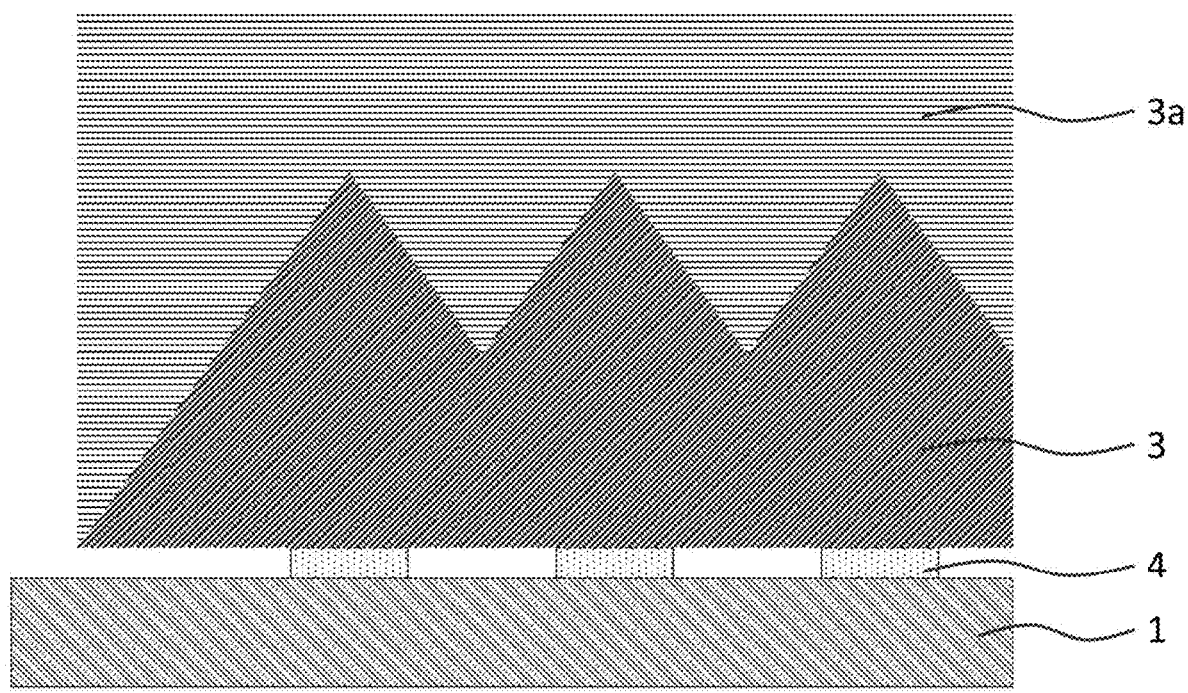
FIG. 8 is a schematic cross-sectional view illustrating crystal growth (second crystal growth) in the method for producing a group III nitride crystal according to Embodiment 1 of the present disclosure.

In crystal growth, a step of growing second group III nitride crystal 3a with a flat surface on group III nitride crystal (first group III nitride crystal) 3 formed by coupling a plurality of pyramidal crystals as illustrated in FIG. 8 (herein, also referred to as "second crystal growth") may be further performed.

First Crystal Growth

First crystal growth is performed in production apparatus 100 for group III nitride crystals illustrated in FIG. 1. As illustrated in FIG. 1, production apparatus 100 for group III nitride crystals includes reaction chamber 103 formed, for example, of stainless steel or a heat insulation material, and crucible 102 is installed in reaction chamber 103. Crucible 102 is formed, for example, of boron nitride (BN) or alumina ($Al_2O_3$). Heaters 110 are disposed around reaction chamber 103, and heaters 110 are designed so as to adjust the temperature of the inside of reaction chamber 103, in particular, the temperature of the inside of crucible 102. Substrate-holding mechanism 114 that vertically movably holds substrate 11 provided with the above-described seed crystals is installed in group III nitride crystal production apparatus 100. Nitrogen feed line 113 that feeds nitrogen gas is connected to reaction chamber 103, and nitrogen feed line 113 is connected to a raw material gas cylinder or the like (not shown).

In first crystal growth, first, Na, which later acts as a flux, and Ga as a group III element are put in crucible 102 in reaction chamber 103 in group III nitride crystal production apparatus 100. The load of Na and Ga is about 85:15 to 50:50 in a ratio of amounts of moles. At this time, trace amounts of additives may be added, as necessary. If these operations are performed in air, Na may be oxidized. In view of this, the operations are preferably performed in an environment filled with an inert gas such as Ar and nitrogen gas. Subsequently, reaction chamber 103 is sealed, the temperature of the crucible is adjusted to 800° C. or higher and 1,000° C. or lower, more preferably to 850° C. or higher and 950° C. or lower, and nitrogen gas is further sent into reaction chamber 103. At this time, the gas pressure in reaction chamber 103 is set to $1\times10^6$ Pa or higher and $1\times10^7$ Pa or lower, more preferably to $3\times10^6$ Pa or higher and $5\times10^6$ Pa or lower. Raising the gas pressure in reaction chamber 103 facilitates dissolution of nitrogen in Na molten under high temperature, and setting to the mentioned temperature and pressure allows GaN crystals to grow at high speed. Thereafter, retention or mixing by stirring or the like is performed until Na, Ga, and trace amounts of additives are homogeneously mixed. Retention or mixing by stirring is preferably performed for 1 to 50 hours, and more preferably performed for 10 to 25 hours. By performing retention or mixing by stirring for such duration, Na, Ga, and trace amounts of additives can be homogeneously mixed. At this time, if substrate 11 contacts with melt 12 of Na and Ga that is at a temperature lower than the specified temperature or has not been homogeneously mixed, seed crystals 4 may be etched or GaN crystals of poor quality may be precipitated. Hence, it is preferred to hold substrate 11 in the upper part of reaction chamber 103 by substrate-holding mechanism 114.

Thereafter, as illustrated in FIG. 2, substrate 11 is soaked in melt 12. Stirring or the like may be performed for melt 12 in soaking. Stirring of melt 12 may be performed by physically moving crucible 102 through rocking, rotating, and so on, and melt 12 may be stirred by using a stirring bar, an impeller, or the like. Alternatively, melt 12 may be stirred by thermal convection caused by generating a thermal gradient in melt 12. By stirring, the Ga and N concentrations of melt 12 can be kept homogeneous to allow crystals to grow stably. Then, Ga in melt 12 and dissolved nitrogen react on the surface of each of GaN seed crystals 4, and GaN monocrystals epitaxially grow on the surface of each of GaN seed crystals 4. Crystal growth with soaking in melt 12 in this state for a certain period of time provides first GaN crystal 3 with pyramids illustrated in FIG. 7. By growing first GaN crystals 3 into pyramids, dislocations with a dislocation density of about $10^7/cm^2$ to $10^9/cm^2$ that are to be carried over from seed crystals 4 formed through the MOCVD method can be focused around the tops of pyramids. Further, in order to achieve the focusing of dislocations and satisfactorily perform subsequent second crystal growth, as illustrated in FIG. 7, it is preferred to perform first crystal growth to such a degree that pyramids grown from a plurality of seed crystals 4 couple together at at least parts of them. This is because if pyramids are not coupling, a GaN crystal with many dislocations disadvantageously grows from an uncoupled part in subsequent second GaN crystal growth.

It has been revealed that the cross-sectional shape of a GaN crystal growing through the flux method depends on nitrogen pressure, and a GaN crystal grows into a pyramid at low pressure, and into a truncated pyramid at high pressure. Nitrogen pressure has influence on the concentration of nitrogen to be dissolved in the melt. Therefore, change in the shape of GaN crystals can be considered to depend on the degree of supersaturation of GaN in the melt. The degree of supersaturation depends not only on nitrogen pressure but also on temperature, and low temperature provides high degree of supersaturation, and high temperature provides low degree of supersaturation. In view of this, it is preferred to appropriately set the nitrogen pressure and temperature in first crystal growth within the aforementioned ranges so as to allow GaN crystals to grow into pyramids.

Second Crystal Growth

Subsequently, as illustrated in FIG. 8, second group III nitride crystal (GaN crystal) 3a with a flat surface is grown to a desired thickness as needed on first group III nitride crystal (GaN crystal) 3 with pyramids. As described above, the cross-sectional shape of a GaN crystal varies with nitrogen pressure and temperature. Thus, the nitrogen pressure and temperature in second crystal growth are appropriately set within the aforementioned ranges so as to provide the GaN crystal to grow with a flat surface. If the thickness of second GaN crystal 3a is large, generation of warping or cracks in the ultimate form of group III nitride crystals 3 and 3a is prevented. If the thickness of the ultimate form of group III nitride crystals (GaN crystals) 3 and 3a is smaller than that of substrate 1 consisting of sapphire, for example, generation of cracks is likely to occur in the GaN crystal. Thus, generation of cracks in the ultimate form of group III nitride crystals (GaN crystals) 3 and 3a can be prevented by providing second GaN crystal 3a with a large film thickness. Second crystal growth gives a growth mode that facilitates the appearance of flat crystal planes, and thus is a step of growing a flat group III nitride crystal (GaN crystal) to a large thickness. Further, because dislocations have been focused around the tops of the group III nitride crystal (GaN crystal 3) with pyramids in first crystal growth, the dislocation density of group III nitride crystal (GaN crystal) 3a developed in second crystal growth is $10^6/cm^2$ or lower.

After the completion of second crystal growth, it is required for taking out the ultimate form of group III nitride crystals (GaN crystals) 3 and 3a to return the temperature and pressure to normal temperature and normal pressure. Then, the degree of supersaturation in melt 12 largely varies, and if seed substrate 11 is still soaked therein, group III nitride crystals (GaN crystals) 3 and 3a may be etched, or GaN crystals of low quality may be precipitated. For this reason, it is preferred to return the temperature and pressure to normal temperature and normal pressure with seed substrate 11 pulled out of melt 12 after the completion of second GaN crystal growth.

(Separation)

Figure 9:
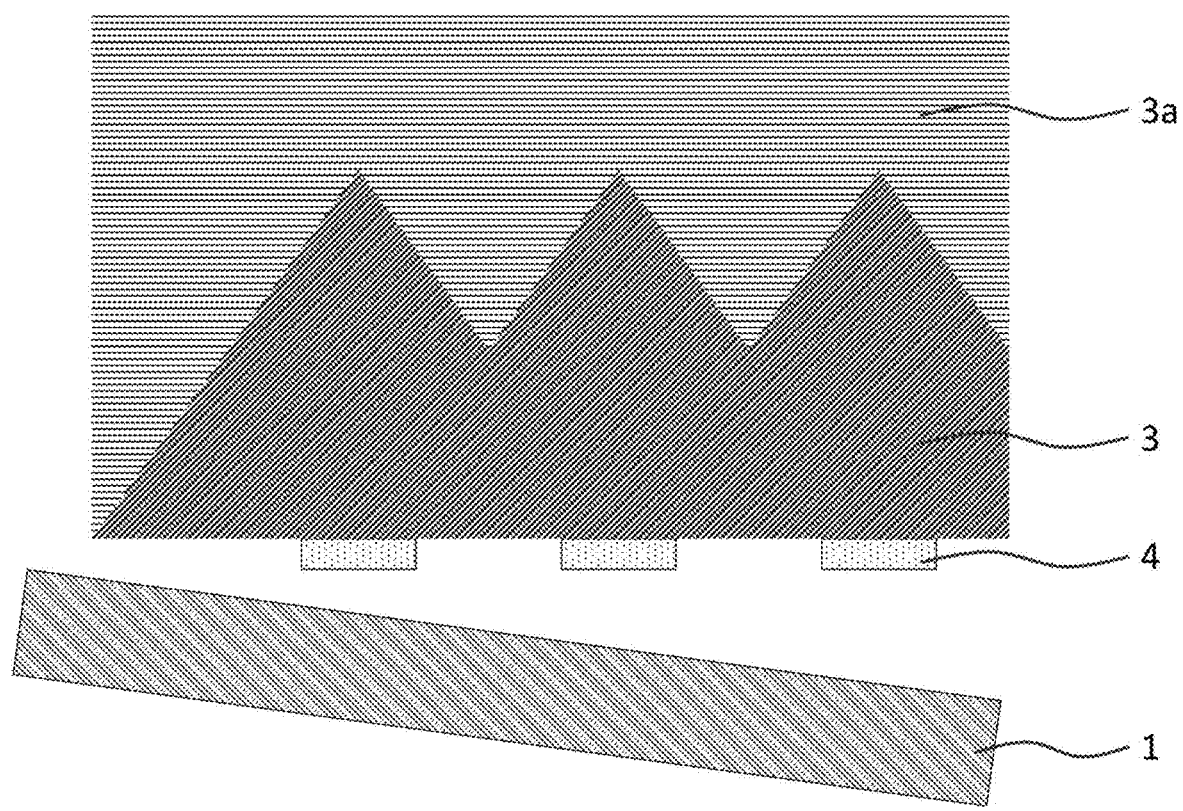
FIG. 9 is a schematic cross-sectional view illustrating separation in the method for producing a group III nitride crystal according to Embodiment 1 of the present disclosure.

After the above-described crystal growth, separation that separates group III nitride crystal (first group III nitride crystal) 3 from substrate 1 in the vicinity of seed crystals 4 as illustrated in FIG. 9 may be further included. Thereby, generation of breaking or cracks is less likely to occur in the ultimate form of group III nitride crystals 3 and 3a.

For example, the coefficient of thermal expansion of group III nitride crystals (GaN crystals) 3 and 3a and that of substrate 1 consisting of sapphire are different at temperatures from a crystal growth temperature of 850 to 950° C. to normal temperature. Hence, by utilizing the difference in the coefficient of thermal expansion between group III nitride crystals (GaN crystals) 3 and 3a and substrate 1 consisting of sapphire in the process of cooling to normal temperature, they can be separated from each other in the vicinity of seed crystals 4, where the cross-sectional area is the smallest and rupture easily occurs. Thereby, group III nitride crystals (GaN crystals) 3 and 3 of large size with generation of warping or cracks prevented can be obtained.

(Additional Step)

Figure 10:
FIG. 10 is a schematic cross-sectional view illustrating polishing in the method for producing a group III nitride crystal according to Embodiment 1 of the present disclosure.

GaN crystal substrate 21 of large diameter may be produced, as illustrated in FIG. 10, by removing GaN seed crystals 4 and first group III nitride crystal (first GaN crystal) 3 from group III nitride crystals (GaN crystals) 3 and 3a of large size obtained, and further polishing the surface (the upper side in the figure). Inclusion of high-dislocation regions can be prevented by removing GaN seed crystals 4 and first group III nitride crystal (first GaN crystal) 3. GaN crystal substrate 21 is a crystal obtained through crystal growth under conditions that facilitate the appearance of flat planes (second crystal growth). Hence, a growth mode that allows the appearance of an inclined plane such as the (10-11) plane is not included, and the concentration of impurities to be incorporated in the crystal can be reduced.

Other Embodiments

In the above crystal growth, the electroconductivity and band gap of GaN to be obtained can be adjusted with addition of trace amounts of additives together with Na and Ga. Examples of trace amounts of additives include compounds containing at least one element selected from the group of boron (B), thallium (Tl), and calcium (Ca); and silicon (Si), sulfur (S) selenium (Se), tellurium (Te), carbon (C), oxygen (O), aluminum (Al), indium (In), alumina ($Al_2O_3$), indium nitride (InN), silicon nitride ($Si_3N_4$), silicon oxide ($SiO_2$), indium oxide ($In_2O_3$), zinc (Zn), magnesium (Mg), zinc oxide (ZnO), magnesium oxide (MgO), and germanium (Ge). Only one or two or more of these trace amounts of additives may be added.

Although a mode using Na as a flux has been described in the above, the present disclosure is not limited to the mode, and an alkali metal other than Na may be used. Specifically, a mixed flux containing at least one selected from the group consisting of Na, Li, K, Rb, Cs, and Fr, for example, a mixed flux of Na and Li may be used.

Further, although a mode of forming crystals of GaN as a group III nitride has been described, the present disclosure is not limited to the mode. The group III nitride of the present disclosure can be a binary, tertiary, or quaternary compound containing a group III element (Al, Ga, or In) and nitrogen. For example, the group III nitride can be a compound represented by the general formula $Al_{1-x-y}Ga_yIn_xN$, wherein x and y satisfy $0 \leq x \leq 1$, $0 \leq y \leq 1$, and $0 \leq 1-x-y \leq 1$. The group III nitride may contain a p-type impurity or an n-type impurity. Although the material of seed crystal 4 is likewise regarded as GaN in the above description, any of the group III nitrides shown above can be used.

The present disclosure includes appropriate combinations of an embodiment and/or Example arbitrarily selected from the aforementioned various embodiments and/or Examples, and the combinations can exert the advantageous effect that each embodiment and/or Example has.

INDUSTRIAL APPLICABILITY

By using the method for producing a group III nitride crystal according to the present disclosure and the seed substrate for use in the production, group III nitride crystals of large size without generation of breaking or cracks can be obtained with high yields. This enables production of LED elements with high brightness, power device elements with low loss, and so on with satisfactory yields at low cost.

REFERENCE SIGNS LIST

1, 31 Substrate
2, 32 Region for disposing seed crystals
3 First group III nitride crystal (first GaN)
3a Second group III nitride crystal (second GaN)
4 Seed crystal
11 Seed substrate
12 Melt
21 Group III nitride crystal substrate
33 Group III nitride crystal
33a Jagged structure
100 Group III nitride crystal production apparatus
102 Crucible
103 Reaction chamber
110 Heater
113 Nitrogen feed line
114 Substrate-holding mechanism

The invention claimed is:

1. A method for producing a group III nitride crystal, the method comprising:
    seed crystal preparation including disposing a plurality of crystals of a group III nitride as a plurality of seed crystals on a substrate; and
    crystal growth including growing a group III nitride crystal on each of the seed crystals by contacting a surface of each of the seed crystals with a melt containing at least one group III element selected from gallium, aluminum, and indium and an alkali metal in an atmosphere containing nitrogen;
    wherein in the seed crystal preparation, the plurality of seed crystals are disposed only inside a substantial regular hexagonal region provided on the substrate;

wherein the substantial regular hexagonal region is filled with the seed crystals in a form of dots with a diameter of 10 to 1,000 μm and a pitch of dots of 1.5 to 10 times the diameter;

wherein the crystal growth comprises first crystal growth including growing a group III nitride crystal on each seed crystal into a pyramid to obtain a first group III nitride crystal formed of adjacent pyramidal group III nitride crystals partially coupled to each other, and second crystal growth including growing second group III nitride crystal with a flat surface on the first group III nitride crystal;

wherein a distance between an outer periphery of the substrate and a center of a seed crystal the nearest to the outer periphery of the substrate among the seed crystals to be disposed in the seed crystal preparation is larger than a value obtained by dividing a maximum value of film thicknesses of the pyramidal group III nitride crystals to be grown in the first crystal growth by the square root of 3.

2. The method for producing a group III nitride crystal according to claim 1, wherein, in the crystal growth, each side of an outer periphery of the substantial regular hexagonal region is matched up with a specific crystal plane of the group III nitride crystal.

3. The method for producing a group III nitride crystal according to claim 2, wherein the specific crystal plane is a (1-100) plane.

4. The method for producing a group III nitride crystal according to claim 1, wherein, among the seed crystals to be disposed in the seed crystal preparation, a seed crystal positioned the nearest to an outer periphery of the substantial regular hexagonal region has the same shape as seed crystals positioned in a center side of the substantial regular hexagonal region.

5. The method for producing a group III nitride crystal according to claim 1, further comprising separation including separating the group III nitride crystals from the substrate in the vicinity of the seed crystals after the crystal growth.

6. A seed substrate, comprising:

a substrate; and a plurality of seed crystals including a plurality of crystals of a group III nitride, the crystals disposed only inside a substantial regular hexagonal region provided on the substrates;

wherein the substantial regular hexagonal region is filled with the seed crystals in a form of dots with a diameter of 10 to 1,000 μm and a pitch of dots of 1.5 to 10 times the diameter.

7. The seed substrate according to claim 6, wherein the seed substrate is used as a growth substrate for a group III nitride crystal, and each side of an outer periphery of the substantial regular hexagonal region is matched up with a specific crystal plane of the group III nitride crystal.

8. The seed substrate according to claim 7, wherein the specific crystal plane of the group III nitride crystal is a (1-100) plane.

9. The seed substrate according to claim 6, wherein a seed crystal positioned the nearest to an outer periphery of the substantial regular hexagonal region has the same shape as seed crystals in a center side of the hexagonal region.

* * * * *